(12) United States Patent
Yamazaki

(10) Patent No.: US 9,773,639 B2
(45) Date of Patent: Sep. 26, 2017

(54) ELECTRON MICROSCOPE

(71) Applicant: JEOL Ltd., Tokyo (JP)

(72) Inventor: Kazuya Yamazaki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/196,149

(22) Filed: Jun. 29, 2016

(65) Prior Publication Data

US 2017/0025244 A1    Jan. 26, 2017

(30) Foreign Application Priority Data

Jun. 30, 2015  (JP) .................................. 2015-130715

(51) Int. Cl.
  *H01J 37/26*   (2006.01)
  *H01J 37/18*   (2006.01)
  *H01J 37/244*  (2006.01)
  *H01J 37/10*   (2006.01)

(52) U.S. Cl.
  CPC ............. *H01J 37/18* (2013.01); *H01J 37/10* (2013.01); *H01J 37/244* (2013.01); *H01J 2237/002* (2013.01); *H01J 2237/022* (2013.01); *H01J 2237/186* (2013.01)

(58) Field of Classification Search
  CPC .. H01J 37/04; H01J 37/07; H01J 37/09; H01J 37/10; H01J 37/26; H01J 37/261; H01J 37/28; H01J 13/32; H01J 17/28; H01J 2237/02; H01J 2237/31705

USPC ................................. 250/306, 307, 310, 311
See application file for complete search history.

(56) References Cited

U.S. PATENT DOCUMENTS 5,270,544 A * 12/1993 Taira ........................ G01T 1/36
                                                250/310
2016/0343538 A1* 11/2016 Kawanishi .............. H01J 37/16

FOREIGN PATENT DOCUMENTS

JP            2002203505 A    7/2002

* cited by examiner

*Primary Examiner* — Nicole Ippolito
(74) *Attorney, Agent, or Firm* — The Webb Law Firm

(57) ABSTRACT

There is provided an electron microscope capable of easily achieving power saving. The electron microscope (100) includes a controller (60) for switching the mode of operation of the microscope from a first mode where electron lenses (12, 14, 18, 20) are activated to a second mode where the electron lenses (12, 14, 18, 20) are not activated. During this operation for making a switch from the first mode to the second mode, the controller (60) performs the steps of: closing a first vacuum gate valve (50), opening a second vacuum gate valve (52), and vacuum pumping the interior of the electron optical column (2) of the microscope by the second vacuum pumping unit (40); then controlling a heating section (26) to heat an adsorptive member (242); then opening the first vacuum gate valve (50), closing the second vacuum gate valve (52), and vacuum pumping the interior of the electron optical column (2) by the first vacuum pumping unit (30); and turning off the electron lenses (12, 14, 18, 20).

5 Claims, 3 Drawing Sheets

ELECTRON MICROSCOPE

BACKGROUND OF THE INVENTION

Field of the Invention

The present invention relates to an electron microscope.

Description of Related Art

In an electron microscope such as a transmission electron microscope (TEM) or a scanning transmission electron microscope (STEM), the most power consuming components are electron lenses. In order to achieve power saving in an electron microscope, it is desirable to deactivate the electron lenses when the microscope is not in use.

Generally, in an electron microscope, the interior of the electron optical column is evacuated by a sputter ion pump, while the interior of the detection chamber (camera chamber) is pumped down by an oil diffusion pump or a turbomolecular pump. Furthermore, an electron microscope is equipped with a sample contamination preventive device to maintain the degree of vacuum in the electron optical column and to prevent contamination of the sample. For example, JP-A-2002-203505 discloses an electron microscope equipped with a sample contamination preventive device (cooling device) for preventing adsorption of contaminants onto the surface of the sample by surrounding the outer periphery of the sample with cryogenically cooled fins and causing the contaminants (such as hydrocarbon molecules) causing contamination of the sample to be adsorbed onto the fins. The fins of the sample contamination preventive device are in thermal contact with a refrigerant tank. This tank is filled with a cryogenic liquid, such as liquid nitrogen or liquid helium, whereby the fins are cooled.

In the sample contamination preventive device, the cryogenic liquid filled in the refrigerant tank evaporates with the elapse of time. Finally, the liquid will disappear, whereupon the temperature of the fins rises rapidly. Gaseous molecules adsorbed on the fins are released in large quantities. This rapidly impairs the degree of vacuum inside the electron optical column. Consequently, the ion sputter pump evacuating the interior of the electron optical column may be damaged and made inoperable. In some cases, the ion sputter pump is destroyed.

Therefore, the user has had to perform manipulations to return the temperature of the fins to room temperature or higher after performing observation and analysis with the electron microscope while using the sample contamination preventive device.

SUMMARY OF THE INVENTION

In view of the foregoing problem, the present invention has been made. One object associated with some aspects of the present invention is to provide an electron microscope capable of achieving energy saving easily.

(1) An electron microscope associated with the present invention comprises: an electron beam source; electron lenses disposed in an electron optical column; a cooling section disposed in the electron optical column and operative to cool an adsorptive member to thereby adsorb contaminant materials that contaminate a sample; a heating section for heating the adsorptive member; a detector disposed in a detection chamber and operative to detect an electron beam transmitted through the sample; a first vacuum pumping unit connected into the electron optical column via a first vacuum gate valve; a second vacuum pumping unit connected into the detection chamber and also connected into the electron optical column via a second vacuum gate valve, the second vacuum pumping unit being capable of operating at pressures higher than pressures at which the first vacuum pumping unit can operate; and a controller for performing an operation to switch the mode of operation of the electron microscope from a first mode where the electron lenses are excited to a second mode where the electron lenses are not excited.

During the operation to switch the mode of operation from the first mode to the second mode, the controller performs the steps of: closing the first vacuum gate valve, opening the second vacuum gate valve, and vacuum pumping the interior of the electron optical column by the second vacuum pumping unit; then controlling the heating section to heat the adsorptive member; then opening the first vacuum gate valve, closing the second vacuum gate valve, and vacuum pumping the interior of the electron optical column by the first vacuum pumping unit; and turning off the electron lenses.

In this electron microscope, during the operation to switch the mode of operation from the first mode to the second mode, the controller controls the heating section to heat the adsorptive member. Therefore, energy saving can be easily achieved. Furthermore, in this electron microscope, during the heating of the adsorptive member, the interior of the electron optical column is vacuum pumped by the second vacuum pumping unit; otherwise, gas produced in large quantities would damage the first vacuum pumping unit.

(2) In one feature of this electron microscope, the controller may perform the step of switching the mode of operation from the second mode to the first mode at a preset date and time.

In this electron microscope, the controller performs the step of switching the mode of operation from the second mode to the first mode at the preset date and time and, therefore, user's labor can be reduced.

(3) In one feature of this electron microscope of (2), during the operation for switching the mode of operation from the second mode to the first mode, the controller may perform the step of operating the electron lenses under preset lens conditions.

In this electron microscope, during the operation to switch the mode of operation from the second mode to the first mode, the controller performs the step of operating the electron lenses under the preset lens conditions. Consequently, user's labor can be reduced.

(4) In an electron microscope of any one of (1)-(3), during the operation for switching the mode of operation from the first mode to the second mode, the controller may perform the step of turning off the second vacuum pumping unit after the step of vacuum pumping the interior of the electron optical column by the first vacuum pumping unit.

In this electron microscope, a greater energy saving can be accomplished, for example, as compared with the case where the step of turning off the second vacuum pumping unit is not performed.

(5) In one feature of the electron microscope of any one of (1)-(4), the first vacuum pumping unit may be a sputter ion pump, while the second vacuum pumping unit may be an oil diffusion pump or a turbomolecular pump.

DESCRIPTION OF THE INVENTION

The preferred embodiment of the present invention is hereinafter described in detail with reference to the drawings. It is to be understood that the embodiment described below is not intended to unduly restrict the content of the present invention delineated by the claims and that not all the configurations described below are essential constituent components of the invention.

1. Electron Microscope

Figure 1:
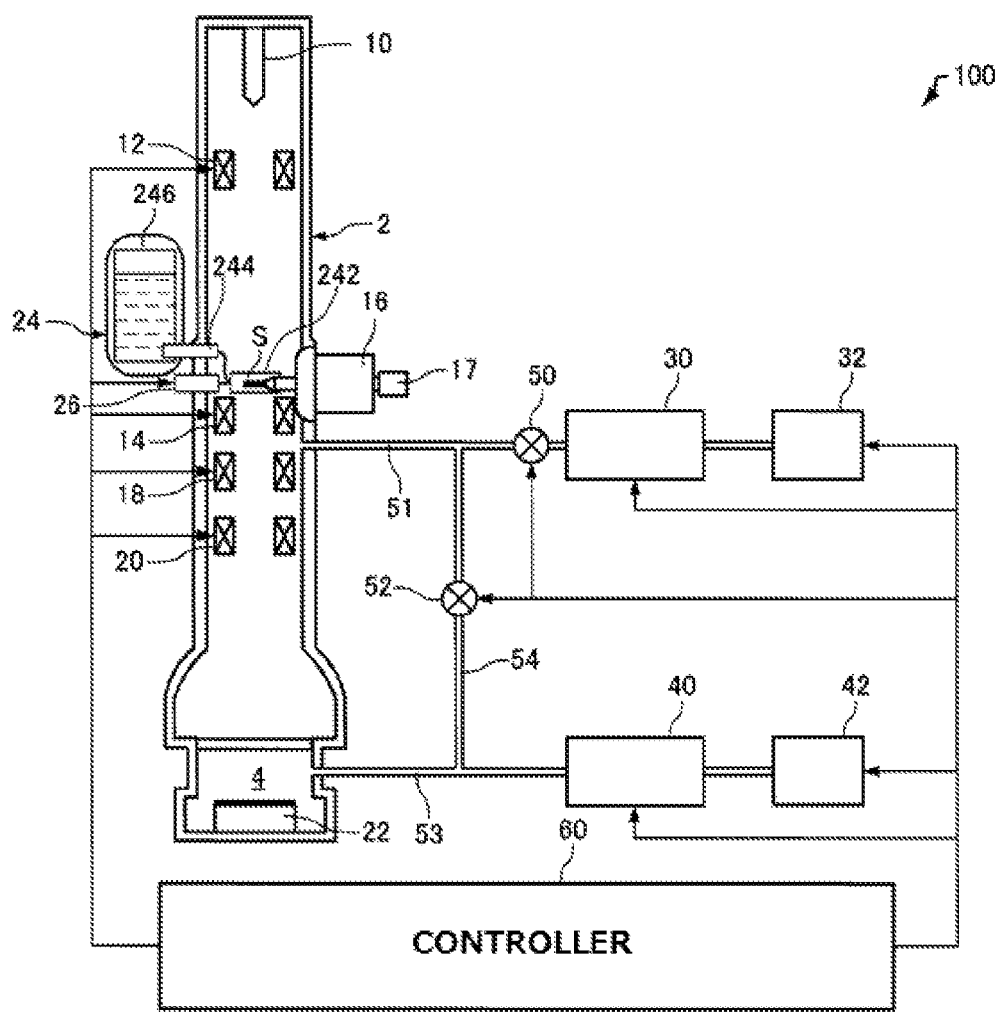
FIG. 1 is a schematic view, partly in block form, of an electron microscope associated with one embodiment of the present invention.

An electron microscope associated with an embodiment of the present invention is first described by referring to FIG. 1, which schematically shows the electron microscope, 100, associated with the present embodiment.

The electron microscope 100 is a transmission electron microscope (TEM). That is, the electron microscope 100 is an instrument for focusing electrons transmitted through a sample S and obtaining a transmission electron microscope (TEM) image.

Referring still to FIG. 1, the electron microscope 100 includes an electron beam source 10, condenser lenses 12, an objective lens 14, a sample stage 16, a sample holder 17, an intermediate lens 18, a projector lens 20, a detector 22, a cooling section 24, a heating section 26, a first vacuum pumping unit 30, an auxiliary pump 32, a second vacuum pumping unit 40, another auxiliary pump 42, a first vacuum gate valve 50, a second vacuum gate valve 52, and a controller 60.

The electron beam source 10 produces an electron beam by accelerating electrons, which are emitted from a cathode, by means of an anode. For instance, a well-known electron gun can be used as the electron beam source 10.

The condenser lenses 12 are disposed behind (i.e., on the downstream side relative to the direction of travel of an electron beam) the electron beam source 10. The condenser lenses 12 are used such that the electron beam emanating from the electron beam source 10 is focused onto the sample S.

The objective lens 14 is disposed behind the condenser lenses 12. The objective lens 14 is an initial stage of lens for imaging the electron beam transmitted through the sample S. The objective lens 14 has a top polepiece and a bottom polepiece (both of which are not shown). In the objective lens 14, a magnetic field is produced between the top and bottom polepieces to condense the electron beam.

The sample stage 16 holds the sample S. In the illustrated example, the sample stage 16 holds the sample S via the sample holder 17. The sample stage 16 places the sample S, for example, between the top and bottom polepieces of the objective lens 14. The sample stage 16 can move and stop the sample holder 17, and can place the sample S in position.

The intermediate lens 18 is disposed behind the objective lens 14. The projector lens 20 is located behind the intermediate lens 18. The intermediate lens 18 and projector lens 20 cooperate to further magnify the image focused by the objective lens 14 and to bring the further magnified image into focus on the detector 22. In the electron microscope 100, an imaging system is constituted by the objective lens 14, intermediate lens 18, and projector lens 20.

The detector 22 detects the electrons transmitted through the sample S. Using the detector 22, a TEM image focused by the imaging system can be captured. For example, the detector 22 is a digital camera such as a CCD camera or a CMOS camera.

The cooling section 24 cools cooling fins 242 that are one example of adsorptive member to adsorb contaminant materials (such as gas molecules, e.g, hydrocarbon molecules) contaminating the sample S. The cooling section 24 has thermal conductive members 244 and a cooling tank 246, as well as the cooling fins 242. The cooling fins 242 are disposed inside the electron optical column 2, and are arranged close to the sample S held to the sample holder 17. The cooling fins 242 are in thermal contact with the refrigerant tank 246 via the thermal conductive members 244. The cooling fins 242 are cooled by filling the refrigerant tank 246 with a cryogenic liquid such as liquid nitrogen or liquid helium. As a result, contaminant materials that contaminate the sample S such as hydrocarbon molecules can be adsorbed onto the cooling fins 242. Hence, the sample S can be prevented from being contaminated. Thus, the cooling section 24 acts as a preventive device against contamination of the sample S.

In this example, the adsorptive member for adsorbing contaminant materials that contaminate the sample S has the cooling fins 242. No restriction is placed on the shape of the adsorptive member of the cooling section 24 as long as it can adsorb contaminant materials that contaminate the sample S. The adsorptive member of the cooling section 24 may be a rod-like member, a plate-like member, or the like.

The heating section 26 heats the cooling fins 242. The heating section 26 is used to heat the cooling fins 242 when the cooling fins 242 are operated to remove gas molecules (such as hydrocarbon molecules) adsorbed on the cooling fins 242. During this degassing process, the cooling fins 242 are heated by the heating section 26 to desorb the gas molecules adsorbed on the cooling fins 242. The heating section 26 is configured, for example, including a heater and thermal transfer members for transferring heat generated by the heater to the cooling fins 242.

In the electron microscope 100, the condenser lenses 12, cooling fins 242, objective lens 14, intermediate lens 18, and projector lens 20 are disposed inside the electron optical column 2. The sample S is introduced into the electron optical column 2 by the sample holder 17. Furthermore, in the electron microscope 100, the detector 22 is positioned in a detection chamber (camera chamber) 4.

The first vacuum pumping unit 30 is connected into the electron optical column 2 via the first vacuum gate valve 50. The first vacuum pumping unit 30 is also connected to an exhaust tube 51 that is in communication with the interior of the electron optical column 2. The first vacuum gate valve 50 is mounted in the exhaust tube 51.

The first vacuum pumping unit 30 is a sputter ion pump, for example. A sputter ion pump is a vacuum pump that makes use of the gettering action of titanium. Since a sputter ion pump can constitute a vacuum pumping system that uses neither oil nor water, the sputter ion pump is well adapted for pumping of the interior of the electron optical column 2. The auxiliary pump 32 is connected to the first vacuum pumping unit 30. An oil rotary pump, a scroll pump, or the like can be used as the auxiliary pump 32.

The second vacuum pumping unit 40 is connected to the detection chamber 4 and also coupled into the electron optical column 2 via the second vacuum gate valve 52. The second vacuum pumping unit 40 is connected to an exhaust tube 53 that is in communication with the detection chamber 4. The exhaust tubes 53 and 51 are connected together by an exhaust tube 54. Therefore, the second vacuum pumping unit 40 is connected into the electron optical column 2 by way of the exhaust tubes 53, 54, and 51. The second vacuum gate valve 52 is mounted in the exhaust tube 54. The interior of the electron optical column 2 can be vacuum pumped with the second vacuum pumping unit 40 by opening the second vacuum gate valve 52.

The second vacuum pumping unit 40 is a pump capable of operating at pressures higher than pressures at which the first vacuum pumping unit 30 can operate. That is, the second vacuum pumping unit 40 can better cope with rapid increases of gas than the first vacuum pumping unit 30. For example, the second vacuum pumping unit 40 is an oil diffusion pump or a turbomolecular pump. An oil diffusion pump heats oil to high temperature, blows off the resulting oil vapor from a nozzle at high speed, and conveys the gas molecules while utilizing the momentum of the ejecting stream. A turbomolecular pump is a mechanical pump that gives a momentum to gas molecules in the direction of ejection by a rotor rotating at high speed and exhausts the gas molecules. The auxiliary pump 42 is connected to the second vacuum pumping unit 40. An oil rotary pump, a scroll pump, or the like can be used as the auxiliary pump 42.

The electron microscope 100 may be equipped with an analytical instrument (not shown) such as an energy-dispersive X-ray spectrometer (EDS) for irradiating the sample S with an electron beam and detecting characteristic X-rays emanating from the sample S or an electron energy loss spectrometer (EELS) for spectrally dispersing the energies of electrons (i.e., inelastically scattered electrons) transmitted through the sample S.

The controller 60 controls the operation of the component parts constituting the electron microscope 100 such as the electron lenses 12, 14, 18, 20, vacuum pumping units 30, 40, auxiliary pumps 32, 42, and vacuum gate valves 50, 52. The controller 60 consists of a CPU (central processing unit) which operates as a computer by executing control programs stored in a storage device (not shown) and which performs various control operations. Alternatively, the controller 60 may be made of dedicated circuitry to perform various control operations. The controller 60 may have a timer for measuring the time.

The controller 60 performs an operation to switch the mode of operation of the electron microscope 100 from a first mode in which the microscope 100 is in conditions for microscopic examination to a second mode in which the microscope 100 is in its power saving state. The controller 60 also performs an operation to switch the mode of operation from the second mode to the first mode.

When the electron microscope 100 is in its microscopic examination mode, observation and analysis of the sample S are possible. In this examination mode, contamination of the sample S is prevented by the cooling section 24. In particular, the refrigerant tank 246 is filled with a cryogenic liquid such as liquid nitrogen or liquid helium, and the cooling fins 242 are cooled.

When the electron microscope 100 is in the first mode where the microscope is in conditions for microscopic examination, the controller 60 activates the electron lenses 12, 14, 18, 20, vacuum pumping units 30, 40, and auxiliary pumps 32, 42. Also, in the first mode, the controller 60 opens the first vacuum gate valve 50 and closes the second vacuum gate valve 52. That is, in the first mode, the first vacuum pumping unit 30 evacuates the interior of the electron optical column 2, and the second vacuum pumping unit 40 pumps down the detection chamber 4.

When the electron microscope 100 is in its power saving state, in the electron microscope 100, at least the electron lenses 12, 14, 18, and 20 are inoperative. Also, in this power saving state, the second vacuum pumping unit 40 and the auxiliary pump 42 may be rendered inoperative. In addition, in the power saving state, the electron beam source 10 may be inoperative.

In the second mode where the electron microscope 100 is in its power saving state, the controller 60 makes the electron lenses 12, 14, 18, 20 inoperative. Also, in the second mode, the controller 60 may deactivate the second vacuum pumping unit 40 and auxiliary pump 42. In this case, the interior of the electron optical column 2 is vacuum pumped by the first vacuum pumping unit 30 but the detection chamber 4 is not evacuated. Furthermore, in the second mode, the controller 60 may also deactivate the electron beam source 10.

The controller 60 controls the electron microscope 100 on the basis of preset details of a desired operation. For example, during an operation to switch the mode of operation from the first mode to the second mode, the controller 60 can make various settings. For instance, the controller 60 makes a decision as to whether degassing of the cooling fins 242 should be done. The controller 60 determines the date and time at which the mode of operation is switched from the second mode to the first mode. The controller 60 can set the states (e.g., magnification and spot size) of the electron lenses 12, 14, 18, and 20 when a switch is made from the second mode to the first mode. The electron microscope 100 has manual control devices such as a touch panel display, a keyboard, a mouse, and so on (not shown) permitting a user to enter these conditions. These conditions are stored in a storage device based on control information from the manual control devices and are set.

The operations of the controller 60 to switch the mode of operation from the first mode to the second mode and vice versa, respectively, are described below.

2. Operation for Making a Switch from First Mode to Second Mode

Figure 2:
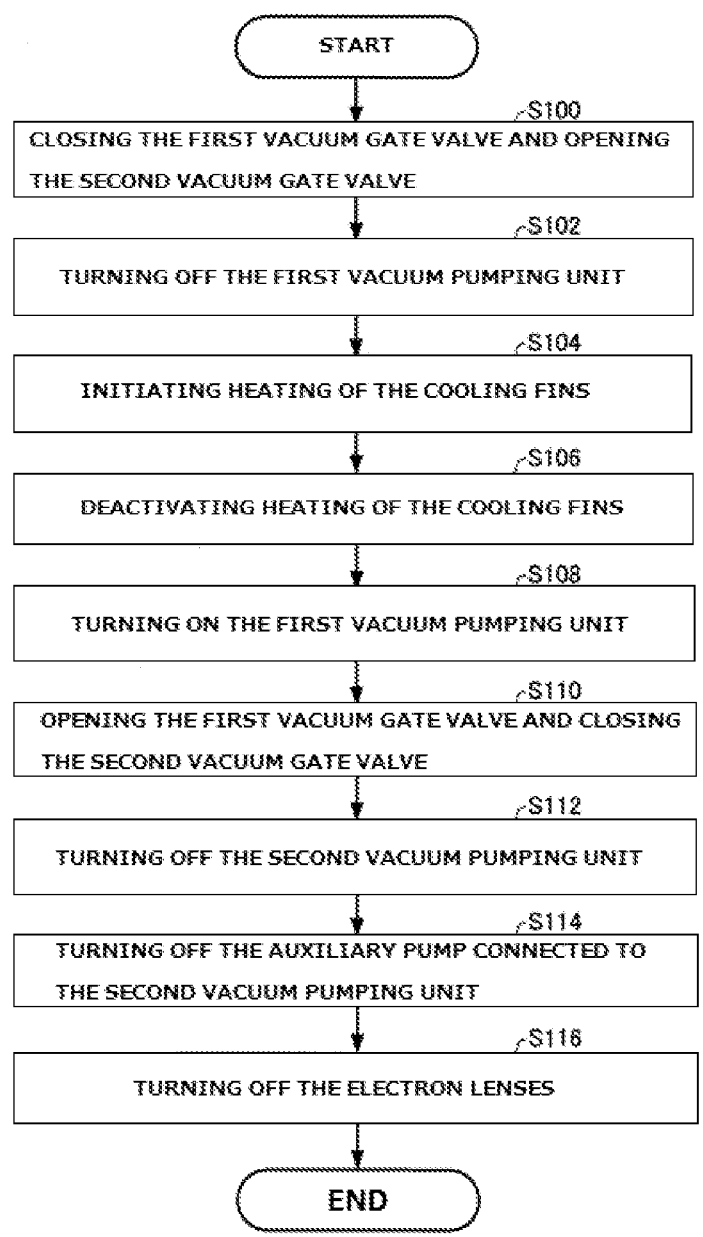
FIG. 2 is a flowchart illustrating one example of subroutine for switching the mode of operation of the electron microscope of FIG. 1 from a first mode to a second mode.

The operation for causing a switch from the first mode to the second mode is first described. FIG. 2 is a flowchart illustrating one example of subroutine for effecting a switch from the first mode to the second mode. When this switch is made, it is assumed that degassing of the cooling fins 242 is scheduled to be done.

When the electron microscope 100 is in its microscopic examination state, if the user asks for a switch to the power saving state via a manual control device, the controller 60 accepts a manual control signal from the manual control device and starts the subroutine for making a switch from the first mode to the second mode.

First, the controller 60 performs degassing for removing gas molecules adsorbed on the cooling fins 242 (steps S100-S110).

In particular, the controller 60 closes the first vacuum gate valve 50 and opens the second vacuum gate valve 52 (step S100). Consequently, the interior of the electron optical column 2 that has been vacuum pumped by the first vacuum pumping unit 30 is evacuated by the second vacuum pumping unit 40.

Then, the controller 60 turns off the first vacuum pumping unit 30 (step S102). As a result, the operation of the first vacuum pumping unit 30 comes to a stop.

The controller 60 then controls the heating section 26 to initiate heating of the cooling fins 242 (step S104). For example, the controller 60 operates the heating section 26 for a predetermined time. Consequently, the temperature of the cooling fins 242 can be raised above room temperature. Thus, the gas molecules adsorbed on the cooling fins 242 are released, producing gas inside the electron optical column 2. The gas is expelled by the second vacuum pumping unit 40. The cryogenic liquid filled in the refrigerant tank 246 decreases in volume during the heating of the cooling fins 242 and finally disappears.

When the predetermined time passes, the controller 60 deactivates the heating section 26 (step S106). That is, the controller 60 controls the heating section 26 to heat the cooling fins 242 for the predetermined time.

Alternatively, the controller 60 may deactivate the heating section 26 on the basis of the results of measurements of the temperature of the cooling fins 242. For example, the electron microscope 100 is equipped with a temperature measuring instrument for measuring the temperature of the cooling fins 242. The controller 60 makes a decision as to whether the temperature of the cooling fins 242 is above room temperature, based on information about the results of measurements outputted from the temperature measuring instrument. If the temperature of the cooling fins 242 is judged to be above room temperature, the controller 60 deactivates the operation of the heating section 26.

The controller 60 then turns on the first vacuum pumping unit 30 (step S108). Consequently, the first vacuum pumping unit 30 is made operative.

The controller 60 then opens the first vacuum gate valve 50 and closes the second vacuum gate valve 52 (step S110). As a consequence, the interior of the electron optical column 2 that has been vacuum pumped by the second vacuum pumping unit 40 is vacuum pumped by the first vacuum pumping unit 30. Because of the processing steps described so far, degassing can be done.

The controller 60 then turns off the second vacuum pumping unit 40 (step S112). As a result, the operation of the second vacuum pumping unit 40 is deactivated.

The controller 60 then turns off the auxiliary pump 42 connected to the second vacuum pumping unit 40 (step S114). As a result, the operation of the auxiliary pump 42 comes to a stop.

The controller 60 then turns off the electron lenses 12, 14, 18, 20 (step S116). As a result, the operation of the electron lenses 12, 14, 18, 20 comes to a stop.

Because of the processing steps described thus far, the mode of operation can be switched from the first mode to the second mode. Consequently, the electron microscope 100 is placed in its power saving state.

3. Operation for Making a Switch from Second Mode to First Mode

Figure 3:
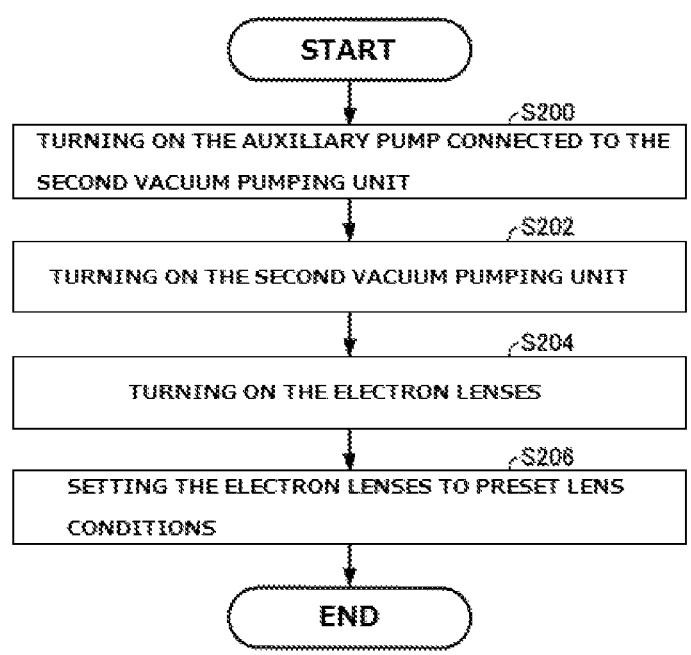
FIG. 3 is a flowchart illustrating one example of subroutine for switching the mode of operation from the second mode back to the first mode.

The operation for making a switch from the second mode to the first mode is next described. FIG. 3 is a flowchart illustrating one example of subroutine for effecting a switch from the second mode to the first mode.

When the electron microscope 100 is in its power saving state, the controller 60 starts the subroutine for making a switch from the second mode to the first mode when a preset date and time arrives.

The controller 60 first turns on the auxiliary pump 42 connected to the second vacuum pumping unit 40 (step S200). In consequence, the auxiliary pump 42 is made operative.

The controller 60 then turns on the second vacuum pumping unit 40 (step S202). As a result, the detection chamber 4 is vacuum pumped by the second vacuum pumping unit 40.

The controller 60 then turns on the electron lenses 12, 14, 18, and 20 (step S204). As a result, the electron lenses 12, 14, 18, and 20 are made operative. Note that no restriction is placed on the order in which these steps S200, S202, and S204 are performed.

The controller 60 then causes the electron lenses 12, 14, 18, and 20 to be operated under preset lens conditions (step S206). For example, if lens conditions such as final magnification and spot size (i.e., the dose of the electron beam) have been preset by the user, the electron lenses 12, 14, 18, and 20 are controlled to meet the set lens conditions.

Because of the processing steps described so far, it is possible to cause a switch from the second mode to the first mode. Consequently, the electron microscope 100 is put in its microscopic examination state.

The electron microscope 100 has the following features. In the electron microscope 100, when the controller 60 performs the operation for switching the mode of operation from the first mode where at least the electron lenses 12, 14, 18, 20 are activated to the second mode where at least the electron lenses 12, 14, 18, 20 are deactivated, the controller 60 performs the steps of: closing the first vacuum gate valve 50, opening the second vacuum gate valve 52, and vacuum pumping the interior of the electron optical column 2 by the second vacuum pumping unit 40; then controlling the heating section 26 to heat the cooling fins 242; then opening the first vacuum gate valve 50, closing the second vacuum gate valve 52, and vacuum pumping the interior of the electron optical column 2 by the first vacuum pumping unit 30; and turning off the electron lenses 12, 14, 18, 20. In this way, in the electron microscope 100, during the operation for making a switch from the first mode to the second mode, the controller 60 controls the heating section 26 to heat the cooling fins 242. This makes it unnecessary for the user to perform a degassing process and thus user's labor can be reduced. Consequently, the electron microscope 100 can be easily placed into its power saving state. Hence, power saving can be easily achieved.

Furthermore, in the electron microscope 100, when the cooling fins 242 are heated, the interior of the electron optical column 2 is pumped down by the second vacuum pumping unit 40; otherwise, the first vacuum pumping unit 30 would be damaged by a large amount of gas produced.

In the electron microscope 100, the controller 60 performs the operation to make a switch from the second mode to the first mode at the preset date and time. If the electron microscope 100 makes a transition from the power saving state to the microscopic examination state, the electron lenses 12, 14, 18, and 20 are turned ON from OFF. The electron lenses 12, 14, 18, and 20 are activated by passing current through their coils. This results in resistive heat, which in turn very slightly deforms the electron lenses 12, 14, 18, and 20. These minute deformations disturb the state of the optical system of the electron microscope and may persist for several hours or more. During this interval, the electron microscope cannot be used under optimum conditions. Therefore, the user has conventionally had to perform a manipulation for making a switch from the second mode to the first mode at a time back calculated from the time at which the electron microscope will be used.

In contrast, in the electron microscope 100, the controller 60 operates to make a switch from the second mode to the first mode at a preset date and time as described previously. Therefore, user's labor can be reduced. Furthermore, the electron microscope 100 allows for a scheduled operation.

In the electron microscope 100, during the operation of making a switch from the second mode to the first mode, the controller 60 performs processing to operate the electron lenses 12, 14, 18, and 20 under preset lens conditions. In the electron microscope, the state of each electron lens is controlled by the amount of current flowing through its coil. Therefore, if the state of the electron lens is varied, the electron lens is minutely deformed in the same way as when the electron lens is switched from OFF to ON as described previously. Consequently, in an electron microscope, in order to perform observation and analysis under optimum conditions, it is necessary to previously operate electron lenses under desired optical conditions. In the electron microscope 100, as described previously, during the operation of the controller 60 for making a switch from the second mode to the first mode, the electron lenses 12, 14, 16, 18, and 20 are operated under preset lens conditions. Hence, user's labor can be reduced.

In the electron microscope 100, during the operation for making a switch from the first mode to the second mode, after the step of vacuum pumping the interior of the electron optical column 2 by the first vacuum pumping unit 30, the step of turning off the second vacuum pumping unit 40 is performed. Therefore, when the operation for making a switch from the first mode to the second mode, greater power saving can be achieved, for example, as compared with the case where the step of turning off the second vacuum pumping unit 40 is not performed.

It is to be understood that the present invention is not restricted to the foregoing embodiment but rather can be practiced in various modified forms without departing from the scope and gist of the invention.

In the above embodiment, an example has been described in which the electron microscope 100 is a transmission electron microscope where a TEM image is obtained by imaging the electron beam transmitted through the sample S. The electron microscope associated with the present invention may also be a scanning transmission electron microscope (STEM) for obtaining an STEM image by scanning the electron beam (electron probe) over the sample S, detecting the intensities either of transmitted waves emanating from various points on the sample or of diffracted waves, and synchronizing the detection of the intensities with the scanning of the electron probe.

The present invention embraces configurations substantially identical (e.g., in function, method, and results or in purpose and advantageous effects) with the configurations described in the embodiment of the invention. Furthermore, the invention embraces configurations described in the embodiment and including portions which have non-essential portions replaced. In addition, the invention embraces configurations which produce the same advantageous effects as those produced by the configurations described in the embodiment or which can achieve the same objects as the configurations described in the embodiment. Further, the invention embraces configurations which are similar to the configurations described in the embodiment except that well-known techniques have been added.

Having thus described my invention with the detail and particularity required by the Patent Laws, what is desired protected by Letters Patent is set forth in the following claims.

The invention claimed is:

1. An electron microscope comprising:
an electron beam source;
electron lenses disposed in an electron optical column;
a cooling section disposed in the electron optical column and operative to cool an adsorptive member to thereby adsorb contaminant materials that contaminate a sample;
a heating section for heating the adsorptive member;
a detector disposed in a detection chamber and operative to detect an electron beam transmitted through the sample;
a first vacuum pumping unit connected into the electron optical column via a first vacuum gate valve;
a second vacuum pumping unit connected into the detection chamber and also connected into the electron optical column via a second vacuum gate valve, the second vacuum pumping unit being capable of operating at pressures higher than pressures at which the first vacuum pumping unit can operate; and
a controller for performing an operation to switch the mode of operation of the electron microscope from a first mode where the electron lenses are excited to a second mode where the electron lenses are not excited;
wherein, during said operation to switch the mode of operation from the first mode to the second mode, the controller performs the steps of:
closing the first vacuum gate valve, opening the second vacuum gate valve, and vacuum pumping the interior of the electron optical column by the second vacuum pumping unit;
then controlling the heating section to heat the adsorptive member;
then opening the first vacuum gate valve, closing the second vacuum gate valve, and vacuum pumping the interior of the electron optical column by the first vacuum pumping unit; and
turning off the electron lenses.

2. The electron microscope as set forth in claim 1, wherein said controller further performs the step of switching the mode of operation from the second mode to the first mode at a preset date and time.

3. The electron microscope as set forth in claim 2, wherein, during said operation for switching the mode of operation from the second mode to the first mode, said controller performs the step of operating said electron lenses under preset lens conditions.

4. The electron microscope as set forth in claim 1, wherein, during said operation for switching the mode of operation from the first mode to the second mode, said controller performs the step of turning off said second vacuum pumping unit after the step of vacuum pumping the interior of said electron optical column by said first vacuum pumping unit.

5. The electron microscope as set forth in claim 1, wherein said first vacuum pumping unit is a sputter ion pump, while said second vacuum pumping unit is an oil diffusion pump or a turbomolecular pump.

* * * * *